(12) United States Patent
Fujiwara et al.

(10) Patent No.: US 11,274,225 B2
(45) Date of Patent: Mar. 15, 2022

(54) ROOM TEMPERATURE-VULCANIZING SILANE-CONTAINING RESIN COMPOSITION AND MOUNTING CIRCUIT SUBSTRATE

(71) Applicant: SHIN-ETSU CHEMICAL CO., LTD., Tokyo (JP)

(72) Inventors: Akitsugu Fujiwara, Annaka (JP); Munenao Hirokami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 169 days.

(21) Appl. No.: 16/476,366

(22) PCT Filed: Dec. 22, 2017

(86) PCT No.: PCT/JP2017/046082
§ 371 (c)(1),
(2) Date: Jul. 8, 2019

(87) PCT Pub. No.: WO2018/139134
PCT Pub. Date: Aug. 2, 2018

(65) Prior Publication Data
US 2020/0040208 A1    Feb. 6, 2020

(30) Foreign Application Priority Data

Jan. 30, 2017    (JP) .............................. JP2017-014254

(51) Int. Cl.
| | |
|---|---|
| *C09D 115/00* | (2006.01) |
| *C08L 15/00* | (2006.01) |
| *H05K 1/18* | (2006.01) |
| *H05K 3/28* | (2006.01) |
| *H01L 23/29* | (2006.01) |
| *H05K 1/03* | (2006.01) |
| *H01L 23/31* | (2006.01) |
| *C08C 19/25* | (2006.01) |

(52) U.S. Cl.
CPC ............ *C09D 115/00* (2013.01); *C08C 19/25* (2013.01); *C08L 15/00* (2013.01); *H01L 23/29* (2013.01); *H01L 23/31* (2013.01); *H05K 1/0326* (2013.01); *H05K 1/181* (2013.01); *H05K 3/28* (2013.01); *C08L 2312/08* (2013.01); *H05K 2201/0162* (2013.01); *H05K 2201/10136* (2013.01)

(58) Field of Classification Search
CPC ........ C08C 19/25; C08L 2312/08; C08L 9/00; C08L 15/00; C08F 36/06; C08F 8/42
See application file for complete search history.

(56) References Cited

U.S. PATENT DOCUMENTS

| | | | | |
|---|---|---|---|---|
| 4,230,815 | A | * | 10/1980 | Itoh .......................... C08C 19/25 525/101 |
| 2003/0105206 | A1 | | 6/2003 | Hara et al. |
| 2005/0215706 | A1 | | 9/2005 | Sakamoto et al. |
| 2014/0182887 | A1 | * | 7/2014 | Yoshioka ............... H05K 1/111 174/250 |
| 2014/0203323 | A1 | | 7/2014 | Ozai |
| 2019/0016876 | A1 | | 1/2019 | Hirokami |

FOREIGN PATENT DOCUMENTS

| | | |
|---|---|---|
| CA | 1 196 927 | 11/1985 |
| EP | 3 466 996 A1 | 4/2019 |
| JP | 58-25308 A | 2/1983 |
| JP | 58-173106 A | 10/1983 |
| JP | 59-25828 A | 2/1984 |
| JP | 59-186602 A | 10/1984 |
| JP | 9-59317 A | 3/1997 |

(Continued)

OTHER PUBLICATIONS

Liquid Rubber Grades. Kuraray. https://www.elastomer.kuraray.com/klr/grades/. As viewed on May 12, 2021. (Year: 2021).*

(Continued)

*Primary Examiner* — Stephen E Rieth
(74) *Attorney, Agent, or Firm* — Birch, Stewart, Kolasch & Birch, LLP

(57) ABSTRACT

Room temperature-vulcanizing silane-containing resin compositions are described, containing: (A) 100 parts by mass of a silane-modified polybutadiene compound represented by formula (1)

$$H \text{—}[H_2C\text{—}HC\text{=}CH\text{—}CH_2]_e\text{—}[CH_2\text{—}\underset{\underset{\underset{CH_2}{\|}}{CH}}{\overset{H}{C}}]_f\text{—}[CH_2\text{—}\underset{\underset{\underset{\underset{R^2_{3-m}}{|}}{Si\text{—}(OR^1)_m}}{\underset{CH_2}{|}}}{\overset{H}{C}}]_g\text{—}H \quad (1)$$

(B) 0.5 to 20 parts by mass of a hydrolyzable organosilane compound having in each molecule an average of at least two silicon atom-bonded hydrolyzable groups, and/or the partial hydrolysis condensate of this hydrolyzable organosilane compound; and (C) 0.1 to 10 parts by mass of a curing catalyst. This room temperature-vulcanizing silane-containing resin composition is suitable for application as a coating agent composition and in particular as, e.g., a coating agent for electrical and electronic components and substrates therefor, and a sealant for liquid crystal display elements. The room temperature-vulcanizing silane-containing resin composition provides a gas permeation-resistant coating film (cured material) and is useful as a coating agent that exhibits a corrosion-inhibiting capability versus corrosive gases.

5 Claims, No Drawings

(56) References Cited

FOREIGN PATENT DOCUMENTS

| JP | 9-263607 A | 10/1997 |
|----|------------|---------|
| JP | 2001-262040 A | 9/2001 |
| JP | 2001-262066 A | 9/2001 |
| JP | 2002-80783 A | 3/2002 |
| JP | 2002-293991 A | 10/2002 |
| JP | 2003-64104 A | 3/2003 |
| JP | 4114037 B2 | 7/2008 |
| JP | 4186071 B2 | 11/2008 |
| JP | 2014-157849 A | 8/2014 |
| JP | 2016-191040 A | 11/2016 |
| JP | 2017-8301 A | 1/2017 |
| JP | 2017-193603 A | 10/2017 |

OTHER PUBLICATIONS

International Search Report for PCT/JP2017/046082 dated Apr. 3, 2018.
Written Opinion of the International Searching Authority for PCT/JP2017/046082 (PCT/ISA/237) dated Apr. 3, 2018.

\* cited by examiner

ROOM TEMPERATURE-VULCANIZING SILANE-CONTAINING RESIN COMPOSITION AND MOUNTING CIRCUIT SUBSTRATE

TECHNICAL FIELD

This invention relates to a room temperature-curable (or RT-curable) silane-containing resin composition for forming a coating film, specifically to a room temperature-curable silane-containing resin composition suited in the application as coating agent compositions, especially as coating agents for electrical and electronic parts and substrates thereof and sealing agents for liquid crystal display components. More particularly, it relates to a room temperature-curable silane-containing resin composition for forming a cured coating having a corrosion-preventing function against corrosive gases, and a packaged circuit board having a cured coating of the composition.

BACKGROUND ART

Because of ease of handling, weather resistance and satisfactory electrical properties, room temperature-vulcanizable (RTV) silicone rubber compositions which crosslink by moisture are used in a variety of fields including sealing agents for building materials and adhesives in electrical and electronic field. Particularly in the electrical and electronic field, there is a tendency that RTV silicone rubber compositions of dealcoholization type are used because they are suited in bonding and coating to resin-based adherends used in the field. This is also true to the coating agent used in the vicinity of liquid crystal and for power supply circuit boards under the recent rapidly growing demand, that is, RTV silicone rubber compositions of dealcoholization type are used. The silicone rubber base coating agents satisfy their main purposes like insulating and moisture-proof capabilities for electrical and electronic circuits, but substantially lack a corrosion-preventing function to metals such as silver and copper used in electronic parts. These organopolysiloxane compositions are highly gas permeable and allow sulfur-containing corrosive gases, specifically low-molecular-weight gases such as hydrogen sulfide and sulfur dioxide to permeate therethrough to form metal sulfides. Once such metal sulfides are formed, electrical connection is blocked, resulting in electrical and electronic parts losing their performance.

Some exemplary organopolysiloxane compositions which are given resistance to sulfidation by corrosive gases, especially sulfur-containing gases are known in the past.

JP 4114037 (Patent Document 1) proposes a silicone rubber composition for encapsulating or sealing electrical and electronic parts, comprising an organopolysiloxane and 0.5 to 90% by weight of a metal powder susceptible to sulfidation by sulfur-containing gases. It describes that the addition of a metal powder susceptible to sulfidation by sulfur-containing gases is effective for preventing sulfidation of electrical and electronic parts. However, no reference is made to the application for coating electrical and electronic parts. Only the addition curable silicone rubber composition is described in a substantial sense. When a metal powder is added to a coating agent, the coating agent is awkward to handle because the metal powder is likely to settle down.

JP 4186071 (Patent Document 2) discloses a RTV organopolysiloxane composition comprising an organopolysiloxane and 0.1% to less than 20% by weight of a metal powder sulfidable by sulfur and/or sulfur gas, preferably copper powder and/or brass powder. Since these metals are highly reactive with sulfur and/or sulfur gas, the RTV organopolysiloxane composition can be given sulfidation prevention by adding a minor amount of metal powder thereto.

The metal addition is suitable for RTV organopolysiloxane compositions loaded with inorganic fillers, used as sealants for automobile parts and adhesives in electrical and electronic part applications, but unsuitable in low-viscosity materials as used in the coating application because metal particles settle down. Also, since the composition is colored with the metal powder, it is difficult to formulate the composition as a coating material requiring transparency. The metal powder exerts a sulfidation-preventing function by trapping sulfur-containing gas. The metal powder loses the function after it has trapped sulfur-containing gas to its full extent. Since the target is limited to sulfur-containing gases, for example, barrier properties against nitrogen oxide gases are poor.

JP-A 2014-157849 (Patent Document 3) discloses an addition curable silicone primer composition which is effective for preventing metal electrodes on a substrate from corrosion (having improved sulfidation-preventing effect) and a photo-semiconductor device using the composition. The cost of raw material is high because the organopolysiloxane component as the base has a short main skeleton and the siloxane side chain has a high aryl content. No reference is made to the application for coating electrical and electronic parts. Only the addition curable silicone rubber composition is described in a substantial sense.

PRIOR ART DOCUMENTS

Patent Documents

Patent Document 1: JP 4114037

Patent Document 2: JP 4186071

Patent Document 3: JP-A 2014-157849

SUMMARY OF INVENTION

Technical Problem

An object of the invention, which has been made under the above-mentioned circumstances, is to provide a room temperature-curable silane-containing resin composition for forming a coating film, especially a coating film having gas permeation resistance, and a packaged circuit board having a cured coating of the composition.

Solution to Problem

Making extensive investigations to attain the above object, the inventors have found that the above-mentioned requirements are met by a room temperature-curable silane-containing resin composition comprising:

(A) 100 parts by weight of a silane-modified polybutadiene compound having the general formula (1):

[Chem. 1]

$$H-[H_2C-HC=CH-CH_2]_e-[CH_2-\underset{\underset{\underset{CH_2}{\|}}{CH}}{\overset{H}{C}}]_f-[CH_2-\underset{\underset{\underset{\underset{R^2_{3-m}}{|}}{Si-(OR^1)_m}}{\underset{CH_2}{|}}}{\overset{H}{\underset{CH_2}{C}}}]_g-H \quad (1)$$

wherein $R^1$ is each independently a substituted or unsubstituted monovalent hydrocarbon group of 1 to 12 carbon atoms, $R^2$ is each independently a substituted or unsubstituted monovalent hydrocarbon group of 1 to 12 carbon atoms, f is a number of at least 0, e and g each are a number of more than 0, m is an integer of 1 to 3, and the sequence of individual repeat units is arbitrary, (B) 0.5 to 20 parts by weight of a hydrolyzable organosilane compound having on the average at least two silicon-bonded hydrolyzable groups per molecule and/or a partial hydrolytic condensate thereof, and (C) 0.1 to 10 parts by weight of a curing catalyst. The invention is predicated on this finding.

Accordingly, the invention provides a room temperature-curable silane-containing resin composition and a packaged circuit board as defined below.

[1]

A room temperature-curable silane-containing resin composition comprising:

(A) 100 parts by weight of a silane-modified polybutadiene compound having the general formula (1):

[Chem. 2]

$$H-[H_2C-HC=CH-CH_2]_e-[CH_2-\underset{\underset{\underset{CH_2}{\|}}{CH}}{\overset{H}{C}}]_f-[CH_2-\underset{\underset{\underset{\underset{R^2_{3-m}}{|}}{Si-(OR^1)_m}}{\underset{CH_2}{|}}}{\overset{H}{\underset{CH_2}{C}}}]_g-H \quad (1)$$

wherein $R^1$ is each independently a substituted or unsubstituted monovalent hydrocarbon group of 1 to 12 carbon atoms, $R^2$ is each independently a substituted or unsubstituted monovalent hydrocarbon group of 1 to 12 carbon atoms, f is a number of at least 0, e and g each are a number of more than 0, m is an integer of 1 to 3, and the sequence of individual repeat units is arbitrary, (B) 0.5 to 20 parts by weight of a hydrolyzable organosilane compound having on the average at least two silicon-bonded hydrolyzable groups per molecule and/or a partial hydrolytic condensate thereof, and (C) 0.1 to 10 parts by weight of a curing catalyst.

[2]

The room temperature-curable silane-containing resin composition of [1] wherein the silane-modified polybutadiene compound has a number average molecular weight of at least 1,000.

[3]

The room temperature-curable silane-containing resin composition of [1] or [2] wherein in the silane-modified polybutadiene compound having formula (1), e, f and g satisfy the range defined by the formulae (i) and (ii).

$$0.05 \leq g/(e+f+g) < 1.0 \quad (i)$$

$$0.3 \leq g/(f+g) \leq 1.0 \quad (ii)$$

[4]

The room temperature-curable silane-containing resin composition of any one of [1] to [3] which cures into a cured product having a water vapor permeability of 10 to 50 g/m²·day at a thickness of 200 to 500 μm.

[5]

The room temperature-curable silane-containing resin composition of any one of [1] to [4] which is used in coating of electrical and electronic parts.

[6]

A packaged circuit board comprising a circuit board having an electrical or electronic part mounted thereon and a cured coating thereon, the cured coating being a cured product of the room temperature-curable silane-containing resin composition of any one of [1] to [5].

Advantageous Effects of Invention

The room temperature-curable silane-containing resin composition of the invention is suited in the application as coating agent compositions, especially as coating agents for electrical and electronic parts and substrates thereof and sealing agents for liquid crystal display components. In particular, a (cured) coating film having gas permeation resistance is obtained, and the composition is thus useful as a coating agent having a corrosion-preventing function against corrosive gases.

DESCRIPTION OF EMBODIMENTS

Now the invention is described in detail.

[Component (A)]

The room temperature-curable silane-containing resin composition of the invention is characterized by comprising (A) a silane-modified polybutadiene compound having the general formula (1), i.e., a polybutadiene compound containing a hydrolyzable silylethylene group as a side chain substituent on a polymerizable vinyl monomer, as a base polymer.

[Chem. 3]

$$H-[H_2C-HC=CH-CH_2]_e-[CH_2-\underset{\underset{\underset{CH_2}{\|}}{CH}}{\overset{H}{C}}]_f-[CH_2-\underset{\underset{\underset{\underset{R^2_{3-m}}{|}}{Si-(OR^1)_m}}{\underset{CH_2}{|}}}{\overset{H}{\underset{CH_2}{C}}}]_g-H \quad (1)$$

Herein $R^1$ is each independently a substituted or unsubstituted monovalent hydrocarbon group of 1 to 12 carbon atoms, $R^2$ is each independently a substituted or unsubstituted monovalent hydrocarbon group of 1 to 12 carbon atoms; f is a number of at least 0, preferably an integer of 0 to 10, more preferably an integer of 0 to 5; e is a number of more than 0, preferably an integer of 1 to 40, more preferably an integer of 2 to 20; g is a number of more than 0, preferably an integer of 1 to 40, more preferably an integer of 2 to 20; m is an integer of 1 to 3, preferably 2 or 3. Notably, the sequence of individual repeat units is arbitrary.

In formula (1), $R^1$ is a substituted or unsubstituted monovalent hydrocarbon group having 1 to 12 carbon atoms, examples of which include alkyl groups such as methyl, ethyl, propyl, isopropyl, butyl, isobutyl, sec-butyl, tert-butyl, pentyl, hexyl, heptyl, octyl, 2-ethylhexyl, nonyl, decyl and dodecyl; cycloalkyl groups such as cyclopentyl and cyclohexyl; alkenyl groups such as vinyl, allyl, propenyl, butenyl, pentenyl, and hexenyl; aryl groups such as phenyl, tolyl, xylyl, α- and β-naphthyl; aralkyl groups such as benzyl, 2-phenylethyl and 3-phenylpropyl; and substituted forms of the foregoing in which some or all of the hydrogen atoms are substituted by halogen atoms such as F, Cl or Br, cyano or the like, for example, 3-chloropropyl, 3,3,3-trifluoropropyl, 2-cyanoethyl, and alkyl groups having an ether bond oxygen atom as a substituent, such as methoxymethyl, methoxyethyl, ethoxymethyl, and ethoxyethyl. Of these, alkyl groups of 1 to 10 carbon atoms and aryl groups of 6 to 10 carbon atoms are preferred. Alkyl groups such as methyl and ethyl are more preferred, with methyl being most preferred.

In formula (1), $R^2$ is a substituted or unsubstituted monovalent hydrocarbon group having 1 to 12 carbon atoms, examples of which include alkyl groups such as methyl, ethyl, propyl, isopropyl, butyl, isobutyl, sec-butyl, tert-butyl, pentyl, hexyl, heptyl, octyl, 2-ethylhexyl, nonyl, decyl and dodecyl; cycloalkyl groups such as cyclopentyl and cyclohexyl; alkenyl groups such as vinyl, allyl, propenyl, isopropenyl, butenyl, pentenyl, and hexenyl; aryl groups such as phenyl, tolyl, xylyl, α- and β-naphthyl; aralkyl groups such as benzyl, 2-phenylethyl and 3-phenylpropyl; and substituted forms of the foregoing in which some or all of the hydrogen atoms are substituted by halogen atoms such as F, Cl or Br, cyano or the like, for example, 3-chloropropyl, 3,3,3-trifluoropropyl, 2-cyanoethyl. Of these, alkyl groups of 1 to 10 carbon atoms and aryl groups of 6 to 10 carbon atoms are preferred. Alkyl groups such as methyl and ethyl are more preferred, with ethyl being most preferred.

The silane-modified polybutadiene compound should preferably have a number average molecular weight (Mn) of at least 1,000, more preferably at least 2,000. If Mn is less than 1,000, the RT-curable silane-containing resin composition may sometimes fail to be sufficiently adhesive. While the upper limit of Mn is not critical, Mn is typically up to 1,000,000, preferably up to 100,000, more preferably up to 10,000. The molecular weight or degree of polymerization is generally determined as a number average molecular weight or number average degree of polymerization versus polystyrene standards by gel permeation chromatography (GPC) using toluene, tetrahydrofuran (THF) or chloroform as developing solvent (the same holds true, hereinafter).

The silane-modified polybutadiene compound should preferably satisfy the range of the following formula (i).

$$0.05 \leq g/(e+f+g) < 1.0 \tag{i}$$

As is evident from the formula, hydrolyzable silyl group-containing units are preferably contained in an amount of at least 5 mol % of the total of overall repeat units in the main chain. The content of hydrolyzable silyl group-containing units is more preferably at least 10 mol %, especially at least 25 mol %. If the content is less than 5 mol %, the RT-curable silane-containing resin composition may sometimes fail to be sufficiently adhesive. The value of g/(e+f+g) is more preferably 0.1 to 0.95, even more preferably 0.25 to 0.95.

The silane-modified polybutadiene compound should preferably satisfy the range of the following formula (ii).

$$0.3 \leq g/(f+g) \leq 1.0 \tag{ii}$$

As is evident from the formula, hydrolyzable silyl group-containing units are preferably contained in an amount of at least 30 mol %, especially at least 50 mol % of the total of hydrolyzable silyl group-containing units and terminal vinyl-containing units in the main chain. If the content is less than 30 mol %, the RT-curable silane-containing resin composition may sometimes fail to be sufficiently adhesive. The value of g/(f+g) is more preferably 0.5 to 1.0.

In the silane-modified polybutadiene compound, the value of (f+g)/(e+f+g) is preferably from 0.05 to 0.95, more preferably from 0.1 to 0.95, even more preferably from 0.25 to 0.95.

The silane-modified polybutadiene is obtained from hydrosilylation reaction of a polybutadiene compound containing repeat units having a 1,2-vinyl structure (terminal vinyl group) and repeat units having a 2,3-vinylene structure (internal vinylene or internal ethenylene group), represented by the general formula (2):

[Chem. 4]

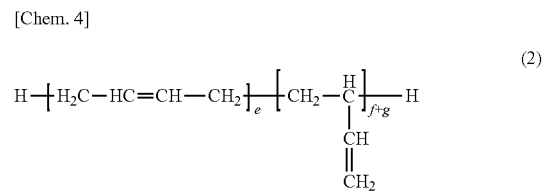

wherein e, f and g are as defined above,
with an organosilicon compound, such as an organohydrogensilane having a silicon-bonded hydrolyzable group ($-OR^1$) and a silicon-bonded hydrogen atom (SiH group) in the molecule, represented by the general formula (3):

[Chem. 5]

wherein $R^1$, $R^2$ and m are as defined above,
in the presence of a platinum compound-containing catalyst and a co-catalyst.

In formula (2), e, f and g are as defined above, and the value of (f+g)/(e+f+g) is likewise preferably from 0.05 to 0.95, more preferably from 0.1 to 0.95, even more preferably from 0.25 to 0.95.

Also, the polybutadiene compound of formula (2) preferably has a number average molecular weight (Mn) of 100 to 10,000, more preferably 500 to 8,000.

The polybutadiene compound having formula (2) contains repeat units having 1,2-vinyl structure and repeat units having 2,3-vinyl structure (trans 1,4-structure) as isomers. The content of repeat units having 1,2-vinyl structure is at least 5 mol %, preferably at least 10 mol %, more preferably at least 25 mol % of the overall repeat units. If the content of 1,2-vinyl structure is less than 5 mol %, the compound has a reduced degree of silane modification, and a RT-curable silane-containing resin composition having the compound blended therein may fail to exert a satisfactory adhesion-improving effect. Although the upper limit of the content of repeat units having 1,2-vinyl structure is not critical, the content is typically up to about 98 mol %, preferably up to about 95 mol %. Notably, the total of repeat units having 1,2-vinyl structure and repeat units having 2,3-vinyl structure is 100 mol %.

Marketed examples of the polybutadiene compound having formula (2) include NISSO-PB B-1000, NISSO-PB B-2000, NISSO-PB B-3000 (by Nippon Soda Co., Ltd.), Ricon 130, Ricon 131, Ricon 134, Ricon 142, Ricon 150, Ricon 152, Ricon 153, Ricon 154, Ricon 156, Ricon 157 (by Cray Valley), LBR-302, LBR-307, LBR-305, LBR-300, LBR-352, LBR-361 (by Kuraray Co., Ltd.).

Examples of the organosilicon compound having formula (3) include hydrogenalkoxysilanes such as trimethoxysilane, methyldimethoxysilane, dimethylmethoxysilane, triethoxysilane, methyldiethoxysilane, and dimethylethoxysilane.

Preferably, the polybutadiene compound having formula (2) is reacted with the organosilicon compound having formula (3) in such a proportion that 10 to 400 parts by weight of the organosilicon compound having formula (3) may be present per 100 parts by weight of the polybutadiene compound having formula (2), and a ratio of SiH groups on the organosilicon compound having formula (3) to vinyl groups on repeat units having 1,2-vinyl structure in the polybutadiene compound having formula (2) may range from 0.3 to 1.0 mol/mol, especially from 0.5 to 1.0 mol/mol.

Although the platinum compound-containing catalyst used herein is not particularly limited, examples include chloroplatinic acid, alcohol solutions of chloroplatinic acid, toluene or xylene solutions of platinum-1,3-divinyl-1,1,3,3-tetramethyldisiloxane complex, tetrakistriphenylphosphine platinum, dichlorobistriphenylphosphine platinum, dichlorobisacetonitrile platinum, dichlorobisbenzonitrile platinum, dichlorocyclooctadiene platinum, and supported catalysts such as platinum-on-carbon, platinum-on-alumina, platinum-on-silica. In view of selectivity, 0-valent platinum complexes are preferably used, with toluene or xylene solutions of platinum-1,3-divinyl-1,1,3,3-tetramethyldisiloxane complex being more preferred.

Although the amount of the platinum compound-containing catalyst used is not particularly limited, it is preferred from the standpoints of reactivity and productivity that the amount of the catalyst be to provide $1\times10^{-7}$ to $1\times10^{-2}$ mole, more preferably $1\times10^{-7}$ to $1\times10^{-3}$ mole of platinum atom per mole of the organosilicon compound having formula (3).

Examples of the co-catalyst used herein include ammonium salts of mineral acids, acid amide compounds, and carboxylic acids.

Exemplary ammonium salts of mineral acids include ammonium chloride, ammonium sulfate, ammonium amidosulfate, ammonium nitrate, monoammonium dihydrogenphosphate, diammonium hydrogenphosphate, triammonium phosphate, ammonium hypophosphite, ammonium carbonate, ammonium hydrogencarbonate, ammonium sulfide, ammonium borate, and ammonium borofluoride. Of these, ammonium salts of mineral acids having a pKa of at least 2 are preferred, with ammonium carbonate and ammonium hydrogencarbonate being more preferred.

Exemplary acid amide compounds include formamide, acetamide, N-methylacetamide, N,N-dimethylacetamide, propionamide, acrylamide, malonamide, succinamide, maleamide, fumaramide, benzamide, phthalamide, palmitamide, and stearamide.

Exemplary carboxylic acids include formic acid, acetic acid, propionic acid, butyric acid, methoxyacetic acid, pentanoic acid, caproic acid, heptanoic acid, octanoic acid, lactic acid, and glycolic acid. Of these, formic acid, acetic acid and lactic acid are preferred, with acetic acid being most preferred.

Although the amount of the co-catalyst used is not particularly limited, it is preferred from the standpoints of reactivity, selectivity and cost that the amount be $1\times10^{-5}$ to $1\times10^{-1}$ mole, more preferably $1\times10^{-4}$ to $5\times10^{-1}$ mole per mole of the organosilicon compound having formula (3).

It is noted that a solvent may be used in the reaction although the reaction takes place in a solventless system. Examples of the solvent used herein include hydrocarbon solvents such as pentane, hexane, cyclohexane, heptane, isooctane, benzene, toluene, xylene; ether solvents such as diethyl ether, tetrahydrofuran, dioxane; ester solvents such as ethyl acetate and butyl acetate; aprotic polar solvents such as N,N-dimethylforamide; and chlorinated hydrocarbon solvents such as dichloromethane and chloroform. These solvents may be used alone or in admixture of two or more.

In the preparation method according to the invention, the reaction temperature is not particularly limited, the reaction may be at room temperature (23±10° C.) or at an elevated temperature. Reaction at an elevated temperature is preferred for obtaining an adequate reaction rate and specifically, the temperature is 35 to 200° C., preferably 40 to 110° C., more preferably 40 to 90° C. The reaction time is preferably 1 to 60 hours, more preferably 1 to 30 hours, even more preferably 1 to 20 hours, though not particularly limited.

[Component (B)]

Component (B) is at least one compound selected from the group consisting of a hydrolyzable organosilane compound having on the average at least two silicon-bonded hydrolyzable groups per molecule, and a partial hydrolytic condensate thereof. It functions as a crosslinker or curing agent for the inventive RT-curable silane-containing resin composition. Exemplary of component (B) are silanes including ketoximesilanes, typically organotris(ketoxime) silanes such as methyltris(dimethylketoxime)silane, methyltris(methylethylketoxime)silane, ethyltris(methylethylketoxime)silane, methyltris(methylisobutylketoxime)silane, vinyltris(methylethylketoxime)silane; organotrialkoxysilanes such as methyltrimethoxysilane, vinyltrimethoxysilane, phenyltrimethoxysilane, methyltriethoxysilane, vinyltriethoxysilane, n-propyltrimethoxysilane, n-hexyltrimethoxysilane, n-decyltrimethoxysilane; diorganodialkoxysilanes such as dimethyldimethoxysilane, dimethyldiethoxysilane, vinyldimethoxymethylsilane; alkoxysilanes such as 1,6-bis(trimethoxysilyl)hexane; alkenoxysilanes such as methyltriisopropenoxysilane, vinyltriisopropenoxysilane, phenyltriisopropenoxysilane; acyloxysilanes, typically acetoxysilanes such as methyltriacetoxysilane, ethyltriacetoxysilane and vinyltriacetoxysilane; and partial hydrolytic condensates of one or more of the foregoing. The alkoxysilanes and alkenoxysilanes are preferred as component (B), with the alkoxysilanes being more preferred.

Component (B) is preferably used in an amount of 0.5 to 20 parts by weight, more preferably 0.8 to 10 parts by weight, even more preferably 1 to 5 parts by weight per 100 parts by weight of component (A). Less than 0.5 part by weight of component (B) fails to provide a cured product having the desired rubber elasticity. More than 20 parts by weight is economically disadvantageous and may lead to a low working efficiency like a delay of tack-free time.

[Component (C)]

The curing catalyst as component (C) may be used alone or in admixture of two or more. Exemplary of component (C) are prior art well-known organometallic catalysts including titanates or titanium chelate compounds such as tetraisopropoxytitanium, tetra-n-butoxytitanium, tetrakis(2-ethylhexoxy)titanium, diisopropoxybis(acetylacetonato)titanium, titanium isopropoxyoctyleneglycol; aluminum alcolates or aluminum chelate compounds such as aluminum isopropylate, aluminum sec-butylate, aluminum ethylate, ethyl acetoacetate aluminum diisopropylate, aluminum tris(ethylacetoacetate), alkylacetoacetate aluminum diisopropylate; lead octylate and other acidic catalysts, and basic catalysts.

Also included are basic non-metallic catalysts, typically strongly basic organosilicon compounds having a guanidyl group such as tetramethylguanidylpropyltrimethoxysilane, tetramethylguanidylpropylmethyldimethoxysilane, and tetramethylguanidylpropyltris(trimethylsiloxy)silane.

Suitable strongly basic organosilicon compounds include compounds having the general formula (4).

[Chem. 6]

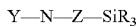

Y—N—Z—SiR₃ (4)

In formula (4), Y is a heteroatom-containing organic group of 1 to 15 carbon atoms, for example, a guanidyl group having the general formula (5). Notably, in formula (5), the bond lines with wave line designate valence bonds to N.

[Chem. 7]

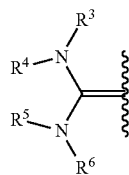

(5)

In formula (5), $R^3$ to $R^6$ are each independently hydrogen or a straight, branched or cyclic alkyl, alkenyl, or aryl group of 1 to 10 carbon atoms, for example, alkyl groups such as methyl, ethyl, propyl, cyclic alkyl groups such as cyclohexyl, alkenyl groups such as vinyl and allyl, aryl groups such as phenyl and tolyl. Of these, methyl, ethyl, and phenyl are preferred, with methyl being most preferred. $R^3$ to $R^6$ may be the same or different.

In formula (4), R is a hydrolyzable group such as alkoxy, isopropenoxy or ketoxime. Examples of SiR₃ include alkoxy-containing silyl groups such as trimethoxysilyl, methyldimethoxysilyl, vinyldimethoxysilyl, phenyldimethoxysilyl and triethoxysilyl; isopropenoxy-containing silyl groups such as triisopropenoxysilyl, methyldiisopropenoxysilyl, ethyldiisopropenoxysilyl, vinyldiisopropenoxysilyl, and phenyldiisopropenoxysilyl; and ketoxime-containing silyl groups such as tris(dimethylketoxime)silyl, tris(diethylketoxime)silyl and tris(ethylmethylketoxime)silyl.

In formula (4), Z is a straight, branched or cyclic alkylene, alkenylene or arylene group of 3 to 10 carbon atoms which may contain a heteroatom, or a combination thereof. Examples include alkylene groups such as methylene, ethylene, propylene, tetramethylene, hexamethylene, octamethylene, decamethylene, 2-methylpropylene, arylene groups such as phenylene, a combination of alkylene group with arylene group, and alkylene groups via a ketone, ester or amide bond. Of these, methylene, ethylene, propylene, and propylene via an amide bond are preferred, with propylene being most preferred.

Examples of the compound having formula (4) include compounds having the formulae (6) to (8).

[Chem. 8]

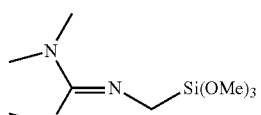

(6)

[Chem. 9]

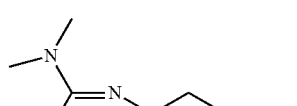

(7)

[Chem. 10]

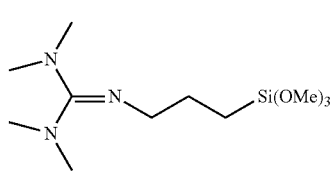

(8)

Herein, Me stands for methyl.

Of these, the compound having formula (8) is preferred.

As component (C), titanium chelate compounds are preferred, with diisopropoxybis(acetylacetonato)titanium being most preferred.

Component (C) is preferably used in an amount of 0.1 to 10 parts by weight, more preferably 0.1 to 8 parts by weight, even more preferably 0.2 to 5 parts by weight per 100 parts by weight of component (A). Less than 0.1 part by weight of component (C) fails to provide sufficient crosslinking whereas more than 10 parts by weight may be disadvantageous in cost and undesirably reduce the curing rate.

[Other Components]

In addition to the foregoing components, fillers and additives may be blended in the RT-curable silane-containing resin composition as long as the performance as coating material is not impaired.

Suitable fillers include ground silica, fumed silica, calcium carbonate, zinc carbonate, aluminum hydroxide, aluminum hydroxide oxide, alumina, magnesium oxide, and wet silica.

Suitable additives include polyethers as a wetter or thixotropic agent and unreactive dimethylsilicone oil as a plasticizer.

If necessary, there may be added coloring agents such as pigments and dyes, fluorescent brighteners, mildew-proof agents, antibacterial agents, unreactive phenylsilicone oil and fluorosilicone oil as bleed oil, surface modifiers such as organic liquids incompatible with silicone, and solvents intended for viscosity adjustment such as toluene, xylene, solvent gasoline, cyclohexanone, methylcyclohexane, and low-boiling isoparaffin. When a compound intended for viscosity adjustment is added, the use of a compound having a kinematic viscosity of about 0.1 to 50 mm$^2$/s at 25° C. is effective.

The RT-curable silane-containing resin composition is obtainable by mixing predetermined amounts of components (A) to (C) and optionally, other components in a dry atmosphere until uniform.

The RT-curable silane-containing resin composition thus obtained cures when it is allowed to stand at RT (23±10° C.). As to the molding method and curing conditions, any of well-known methods and conditions may be selected for a particular type of composition. For example, the composition is cured by allowing it to stand in air under conditions: 23° C. and 50% RH for several hours to several days (for example, 6 hours to 4 days).

When the RT-curable silane-containing resin composition is cured into a thin-film cured product having a thickness of 200 to 500 µm, the cured product preferably has a water vapor permeability of 10 to 50 g/m$^2$·day, especially 10 to 40 g/m$^2$·day in a thickness direction or perpendicular direction. It is noted that the water vapor permeability may be measured by allowing the composition to stand in air under conditions: 23° C. and 50% RH for 4 days into a cured product, and analyzing the cured product at RT (23° C.) by a water vapor permeation analyzer such as L80-5000 by Systech Instruments Ltd.

The RT-curable silane-containing resin composition is adequate in the application as coating agent compositions, especially coating agents for electrical and electronic parts and substrates thereof, and sealing agents for LC display components. Since a gas-permeation-resistant cured product is obtained, the RT-curable silane-containing resin composition is useful as a coating agent capable of preventing permeation of corrosive gases such as hydrogen sulfide gas, sulfur dioxide gas or nitrogen dioxide gas and exerting a corrosion-preventing function to substrates. One embodiment is a packaged circuit board comprising a circuit board having an electrical or electronic part mounted thereon and a cured coating thereon, the cured coating being a cured product of the RT-curable silane-containing resin composition.

When the RT-curable silane-containing resin composition is used as a coating agent, the coating technique may be selected from such techniques as brush coating, dip coating, and spray coating so as to achieve a predetermined coating thickness. The composition as coated (uncured coating) is held, for example, in air under conditions: 23° C. and 50% RH for several hours to several days (for example, 6 hours to 4 days) whereupon a cured product (cured coating film) is obtained.

The thickness of the coating film (cured product film of the RT-curable silane-containing resin composition) is preferably about 50 to 1,000 µm, more preferably about 50 to 800 µm, though not particularly limited.

EXAMPLES

Synthesis Examples, Examples and Comparative Examples are given below for illustrating the invention although the invention is not limited thereto. In Examples, the molecular weight is a number average molecular weight (Mn) as measured by GPC using tetrahydrofuran (THF) as developing solvent versus polystyrene standards. The viscosity is measured at 25° C. by a rotational viscometer.

Synthesis Example 1

Synthesis of Silane-Modified Polybutadiene Compound 1

A 1-L separable flask equipped with a stirrer, reflux condenser, dropping funnel and thermometer was charged with 100 g of Ricon 130 (by Cray Valley, Mn=2,500, formula (2) wherein (f+g)/(e+f+g)=0.28), 200 g of toluene, an amount (0.52×10$^{-4}$ mole of platinum atom) of a toluene solution of platinum-1,3-divinyl-1,1,3,3-tetramethyldisiloxane complex, an d 0.31 g (0.52×10$^{-2}$ mole) of acetic acid. At an internal temperature of 75-85° C., 63 g (0.52 mole) of trimethoxysilane was added dropwise to the contents over 2 hours, followed by stirring at 80° C. for 1 hour.

At the end of stirring, the solution was concentrated in vacuum, yielding a brown transparent liquid having a Mn of 4,100. The molecular weight of the product and the average structure thereof determined from $^1$H-NMR spectroscopy indicate a silane-modified polybutadiene compound having formula (1) wherein e=33, f=0, g=13, R$^1$=methyl, and m=3.

Synthesis Example 2

Synthesis of Silane-Modified Polybutadiene Compound 2

A 1-L separable flask equipped with a stirrer, reflux condenser, dropping funnel and thermometer was charged with 100 g of NISSO-PB B-1000 (by Nippon Soda Co., Ltd., Mn=1,100, formula (2) wherein (f+g)/(e+f+g)=0.9), 200 g of toluene, an amount (1.6×10$^{-4}$ mole of platinum atom) of a toluene solution of platinum-1,3-divinyl-1,1,3,3-tetramethyldisiloxane complex, and 1.0 g (1.6×10$^{-2}$ mole) of acetic acid. At an internal temperature of 75-85° C., 195 g (1.6 moles) of trimethoxysilane was added dropwise to the contents over 2 hours, followed by stirring at 80° C. for 1 hour.

At the end of stirring, the solution was concentrated in vacuum, yielding a brown transparent liquid having a Mn of 3,300. The molecular weight of the product and the average structure thereof determined from $^1$H-NMR spectroscopy indicate a silane-modified polybutadiene compound having formula (1) wherein e=2, f=0, g=18, R$^1$=methyl, and m=3.

Example 1

A composition 1 was obtained by combining 100 parts by weight of silane-modified polybutadiene compound 1 in Synthesis Example 1 as component (A) with 3 parts by weight of methyltrimethoxysilane as component (B) and 0.5 part by weight of diisopropoxybis(acetylacetonato)titanium as component (C), and mixing them at RT (23° C., the same hereinafter) for 10 minutes.

Example 2

A composition 2 was obtained by combining 100 parts by weight of silane-modified polybutadiene compound 1 in Synthesis Example 1 as component (A) with 1.5 parts by weight of 1,6-bis(trimethoxysilyl)hexane as component (B) and 0.5 part by weight of diisopropoxybis(acetylacetonato) titanium as component (C), and mixing them at RT for 10 minutes.

Example 3

A composition 3 was obtained by combining 100 parts by weight of silane-modified polybutadiene compound 2 in Synthesis Example 2 as component (A) with 3 parts by weight of methyltrimethoxysilane as component (B) and 0.5 part by weight of diisopropoxybis(acetylacetonato)titanium as component (C), and mixing them at RT for 10 minutes.

Example 4

A composition 4 was obtained by combining 100 parts by weight of silane-modified polybutadiene compound 2 in Synthesis Example 2 as component (A) with 1.5 parts by weight of 1,6-bis(trimethoxysilyl)hexane as component (B) and 0.5 part by weight of diisopropoxybis(acetylacetonato) titanium as component (C), and mixing them at RT for 10 minutes.

Example 5

A composition 5 was obtained by combining 100 parts by weight of silane-modified polybutadiene compound 1 in Synthesis Example 1 as component (A) with 3 parts by weight of vinyltriisopropenoxysilane as component (B) and 1.0 part by weight of a compound having the following formula (9) as component (C), and mixing them at RT for 10 minutes.

[Chem. 11]

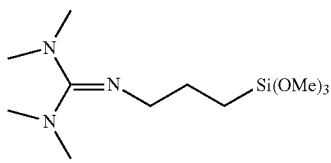

(9)

Herein Me stands for methyl.

Comparative Example 1

A composition 6 was obtained by combining 100 parts by weight of silane-modified polybutadiene compound 1 in Synthesis Example 1 as component (A) with 3 parts by weight of methltrimethoxysilane as component (B), and mixing them at RT for 10 minutes.

Comparative Example 2

A composition 7 was obtained by combining 100 parts by weight of polydimethylsiloxane having a viscosity of 900 mPa·s capped at both ends of the molecular chain with trimethoxysilyl groups instead of the silane-modified polybutadiene compound as component (A) with 3 parts by weight of methltrimethoxysilane as component (B) and 0.5 part by weight of diisopropoxybis(acetylacetonato)titanium as component (C), and mixing them at RT for 10 minutes.

A specimen was fabricated from each of compositions 1 to 7 prepared above, and evaluated for water vapor permeability as an index of corrosive gas permeation. The results are shown in Tables 1 and 2.

Specimen Fabrication

Each of compositions 1 to 7 was coated so as to give a thickness of 350 to 400 µm and allowed to stand in air under conditions: 23° C. and 50% RH for 4 days for curing, yielding a thin film-form cured coating (specimen) having a thickness of 350 to 400 µm. For composition 6 which did not cure, water vapor permeability was not measured.

Evaluation

The specimen was measured for water vapor permeability at RT (23° C.) as an index of corrosive gas permeation by a water vapor permeation analyzer: L80-5000 from Systech Instruments Ltd. A value after 1 hour from the start of measurement was recorded.

TABLE 1

| | Example 1 Composition 1 | Example 2 Composition 2 | Example 3 Composition 3 | Example 4 Composition 4 | Example 5 Composition 5 |
|---|---|---|---|---|---|
| Water vapor permeability (g/m² · day) | 36 | 30 | 35 | 28 | 38 |

TABLE 2

| | Comparative Example 1 Composition 6 | Comparative Example 2 Composition 7 |
|---|---|---|
| Water vapor permeability (g/m² · day) | (uncured) | 120 |

It is evident from the data of compositions 1 to 5 that the water vapor permeability is reduced by using silane-modified polybutadiene compounds 1 and 2.

It is evident from the data of composition 7 that when polydimethylsiloxane is used instead of the silane-modified polybutadiene compound, the water vapor permeability is about 4 times greater than the values of compositions 1 to 5.

The invention claimed is:
1. A room temperature-curable silane-containing resin composition comprising:
(A) 100 parts by weight of a silane-modified polybutadiene compound having the general formula (1):

[Chem. 1]

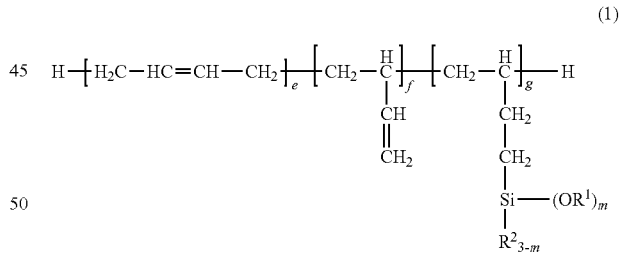

(1)

wherein $R^1$ is each independently a substituted or unsubstituted monovalent hydrocarbon group of 1 to 12 carbon atoms, $R^2$ is each independently a substituted or unsubstituted monovalent hydrocarbon group of 1 to 12 carbon atoms, f is a number of at least 0, e and g each are a number of more than 0, m is an integer of 1 to 3, and the sequence of individual repeat units is arbitrary,
(B) 0.5 to 20 parts by weight of 1,6-bis (trimethoxysilyl) hexane, and
(C) 0.1 to 10 parts by weight of a curing catalyst.
2. The room temperature-curable silane-containing resin composition of claim 1 wherein the silane-modified polybutadiene compound has a number average molecular weight of at least 1,000.

3. The room temperature-curable silane-containing resin composition of claim 1 or 2 wherein in the silane-modified polybutadiene compound having formula (1), e, f and g satisfy the range defined by the formulae (i) and (ii).

$$0.05 \leq g/(e+f+g) < 1.0 \quad \text{(i)}$$

$$0.3 \leq g/(f+g) \leq 1.0 \quad \text{(ii)}$$

4. The room temperature-curable silane-containing resin composition of claim 1 which cures into a cured product having a water vapor permeability of 10 to 30 g/m$^2$·day at a thickness of 350 to 400 μm.

5. A packaged circuit board comprising a circuit board having an electrical or electronic part mounted thereon and a cured coating thereon, the cured coating being a cured product of the room temperature-curable silane-containing resin composition of claim 1.

* * * * *